United States Patent [19]

Chun

[11] Patent Number: 5,572,068
[45] Date of Patent: Nov. 5, 1996

[54] INTEGRATED DOUBLE-CHIP SEMICONDUCTOR PACKAGE AND METHOD FOR FABRICATING SAME

[75] Inventor: Heung Sup Chun, Seoul, Rep. of Korea

[73] Assignee: Goldstar Electron Co., Inc., Rep. of Korea

[21] Appl. No.: 349,132

[22] Filed: Dec. 2, 1994

Related U.S. Application Data

[63] Continuation of Ser. No. 104,244, Aug. 9, 1993, abandoned, which is a continuation of Ser. No. 861,480, Apr. 1, 1992, abandoned.

[30] Foreign Application Priority Data

May 11, 1991 [KR] Rep. of Korea ................ 7632/1991

[51] Int. Cl.$^6$ .................................................. H01L 23/02
[52] U.S. Cl. ...................... 257/686; 257/777; 257/779
[58] Field of Search .................................. 357/75, 70, 74; 257/685, 686, 723, 724, 666, 777, 779, 780, 781, 782

[56] References Cited

U.S. PATENT DOCUMENTS

| | | | |
|---|---|---|---|
| 4,862,322 | 8/1989 | Bickford et al. | 357/75 |
| 4,982,265 | 1/1991 | Watanabe et al. | 357/75 |

FOREIGN PATENT DOCUMENTS

| | | | |
|---|---|---|---|
| 55-12791 | 1/1980 | Japan | 357/70 |
| 58-68959 | 4/1983 | Japan | 357/70 |
| 3-41758 | 2/1991 | Japan | 357/75 |

OTHER PUBLICATIONS

"Encapsulation Schemes for 04–Bonded Tab Packages" IBM Technical Disclosure vol. 33, No. 18, Mar. 1991, pp. 205–207.

Primary Examiner—Sara W. Crane
Assistant Examiner—S. V. Clark
Attorney, Agent, or Firm—Scully, Scott, Murphy & Presser

[57] ABSTRACT

A multi-chip semiconductor package and a method for manufacturing such a package. The package includes a plurality of inner leads of a lead frame, upper and lower semiconductor chips electrically connected to upper and lower surfaces of said inner leads, respectively. The upper and lower chips each has a plurality of pads each having a solder formed thereon. The solder is connected to each inner lead by a soldering, thereby causing the upper and lower chips to be electrically connected to the inner lead, respectively. The method includes the steps of forming polyimide layers on opposite sides of surfaces of the semiconductor chips, forming solders on pads of the semiconductor chips, upon locating inner leads with respect to the solders in order to be disposed at a direction, connecting the inner leads to the solders, and upon superposing an overturned chip on another chip, performing an encapsulation epoxy to the chips in order to cause the chips to be connected to each other. The present invention provides a multi-chip semiconductor package having advantages of improving an integration of circuit and thus causing a desired thickness of the package to be accomplished.

11 Claims, 9 Drawing Sheets

15'  13'  17  13  15

15'  13'  17  13  15

INTEGRATED DOUBLE-CHIP SEMICONDUCTOR PACKAGE AND METHOD FOR FABRICATING SAME

This is a continuation of application(s) Ser. No. 08/104,244 filed on Aug. 9, 1993, which is a FWC of Ser. No. 07/861,480, filed Apr. 1, 1992, both now abandoned.

BACKGROUND OF THE INVENTION

1. Field of the Invention

The present invention relates in general to a multi-chip semiconductor package and a method for manufacturing such a package. Particularly, the present Invention relates to a multi-chip semiconductor package and to a method for manufacturing such a package in which semiconductor chips are secured on upper and lower surfaces of a plurality of inner leads of lead frame having no paddle, respectively, by soldering without additional wire bonding process, thereby reducing the thickness of packages due to Increased integration of the element and also simplifying the manufacturing process thereof and reducing the manufacturing cost.

2. Description of the Prior Art

Recently, in correspondence with integration requirement in the semiconductor techinques, there have been several efforts for enclosing as many chips in a limited space as possible. For example, there have been widely used multi-chip semiconductor packages in which different types of memory chips are enclosed in a memory module, thus providing a piggybag type of package.

The known semiconductor chips used in the above type of multi-chip semiconductor package generally have functions of addressing in a Z-direction instead of a RAS(row address strobe) in the memory module or a board level according to a method such as a SOP(small outline package), a SOJ(small outline J-lead package) or a TSOP(thin small outline package) depending upon types thereof, respectively.

A representative example of the known multi-chip semiconductor package of the piggy-bag type will be described in detail in conjunction with FIGS. 1 and 2, as follows.

With reference to FIG. 1 which is a cross sectional view showing a structure of a known LOC (lead on chip) -SOJ(small outline J-lead package) type of semiconductor package, the package has a semiconductor chip 1 which is provided with insulating polyimide layers 2 coated on the upper side surfaces thereof in order that each has a predetermined thickness throughout the whole length and width thereof. The chip 1 includes a plurality of pads 3 each of which is electrically connected to an end of each inner lead 4 of a lead frame through a wire 5 of which opposite ends are connected to the pad 3 and the inner lead 4, respectively. In addition, the chip 1 is covered with an epoxy resin layer 6 by a molding process to cover a predetermined area including the inner leads 4.

After preparing semiconductor packages having the above mentioned construction, one of the semiconductor packages, as an upper package p", is to be superposed on another semiconductor package p' having the same construction as that of the upper package p", thereafter, they are electrically connected to each other by connection of an outer lead 4" of the upper package p", to an outer lead 4' of the lower package p', thereby providing a piggy-back type of multi-chip semiconductor package p. The known multi-chip semiconductor package p can be installed in a memory module or in a board level by a conventional installing method.

However, to accomplish the process for manufacturing the known multi-chip semiconductor package p, the upper package p", should be superposed on the lower package p', the packages p' and p" having been separately manufactured, then electrically connected thereto by connecting the outer leads 4' and 4" of the packages p' and p", to each other, as described above, Moreover, the multi-chip package p is obliged to have substantial thickness owing to a wire loop height of each package p', p", occurring during the wire bonding process and also owing to the thickness of the epoxy resin layer 6 of each package p', p". Thus, the known multi-chip semiconductor package p has disadvantages in that it can not accomplish a desired thickness thereof and it requires a substantially complex process for being manufactured. That is, each package p', p" is previously separately provided, then one of them is superposed upside down on the other in order to result in the multi-chip package p. In addition, the known multi-chip package 10 has two lead frames and lead wires 5, the number of the lead wires 5 will be two times more than that of the leadframes, thereby necessarily increasing the number of required elements. Accordingly, the known multi-chip semiconductor package has another disadvantage in that it is obliged to increase the manufacturing cost due to the required elements.

The known multi-chip semiconductor package necessarily requires lead wires, resulting in generating a noise and making a boosting speed to be substantially slow.

SUMMARY OF THE INVENTION

It is, therefore, an object of the present invention to provide a multi-chip semiconductor package and a method for manufacturing such a package in which the above disadvantages can b overcome.

It is another object of the present invention to provide a multi-chip semiconductor package and a method for manufacturing such a package in which upper and lower semiconductor chips are connected to upper and lower surfaces of inner leads of a lead frame by soldering, respectively, thereby improving the integration and thus accomplishing a desired thickness of multi-chip package.

It is still another object of the present invention to provide a multi-chip semiconductor package and method for manufacturing such package In which a conventional wire bonding process and a conventional molding process can be omitted, thereby removing a noise, increasing a boosting speed, reducing a manufacturing cost and simplifying the manufacturing process.

In one aspect, the present Invention provides a multi-chip semiconductor package including a plurality of inner leads of a lead frame, and upper and lower semiconductor chips electrically connected to upper and lower surfaces of said inner leads, respectively, the upper and lower chips each having a plurality of pads each having a solder formed thereon, the solder being connected to the inner lead by a soldering process in order to cause the upper and lower chips to be electrically connected to the inner lead.

in another aspect, the present invention provides a method for manufacturing a multi-chip semiconductor package including the steps of forming polyimide layers on opposite sides of a surface of each semiconductor chip, forming solders on pads of the semiconductor chip, upon locating inner leads with respect to the solders so as to be disposed at a direction, respectively, connecting the inner leads to the solders, and upon superposing an overturned chip having been processed in the above steps on another chip having been processed in the above steps, performing an encapsulation epoxy to the chips in order to cause the chips to be connected to each other.

In still another aspect, the present invention provides a method for manufacturing a multi-chip semiconductor package including the steps of forming polyimide layers on opposite sides of the surfaces of upper and lower semiconductor chips, respectively, forming solders on pads of the semiconductor chips, arranging inner leads with respect to the solders of the lower chip so as to be disposed at opposite direction, superposing an overturned upper chip on upper surfaces of the inner leads of the lower chip, heating the inner leads and the upper and lower chips in a reflow furnace in order to have the inner leads and the chips to be connected to each other at the same time, thereafter, performing an encapsulation of the chips with epoxy resin.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
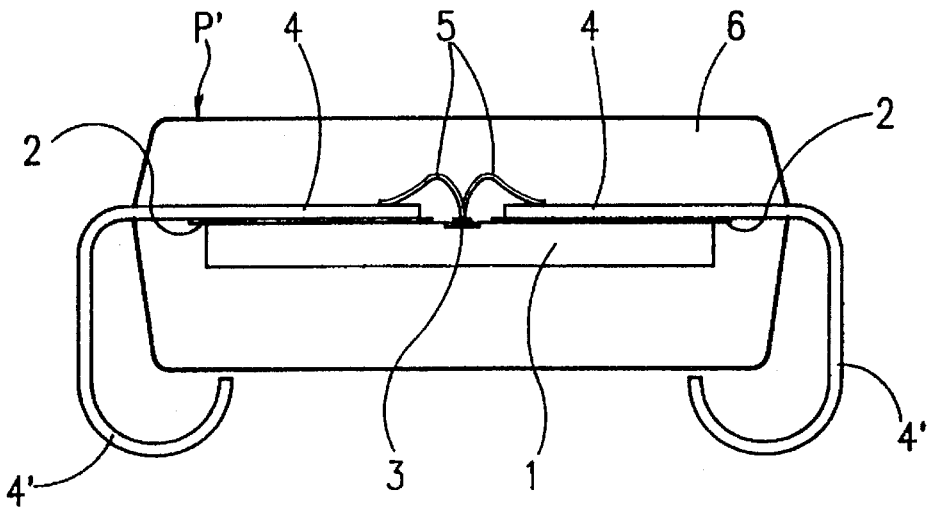
FIG. 1 is a cross sectional view showing a construction of a semiconductor package according to the prior art.
Figure 2:
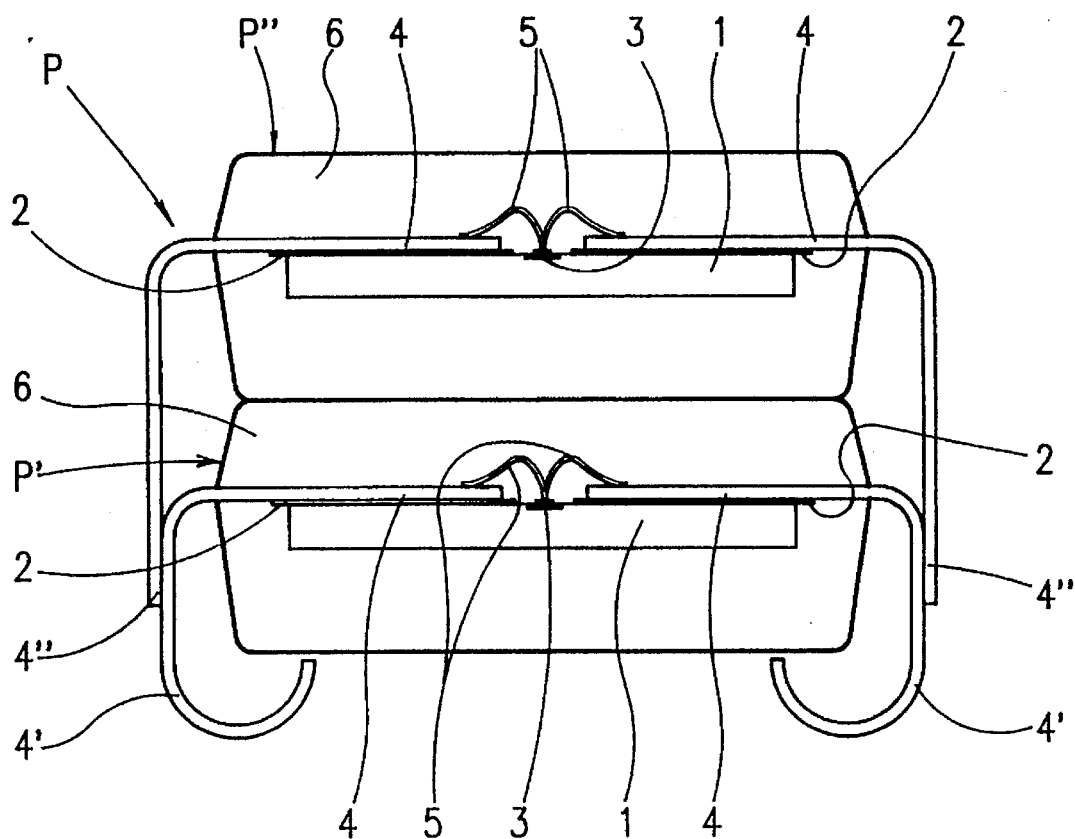
FIG. 2 is a cross sectional view showing a construction of a known multi-chip semiconductor package comprising the packages of FIG. 1.
Figure 3:
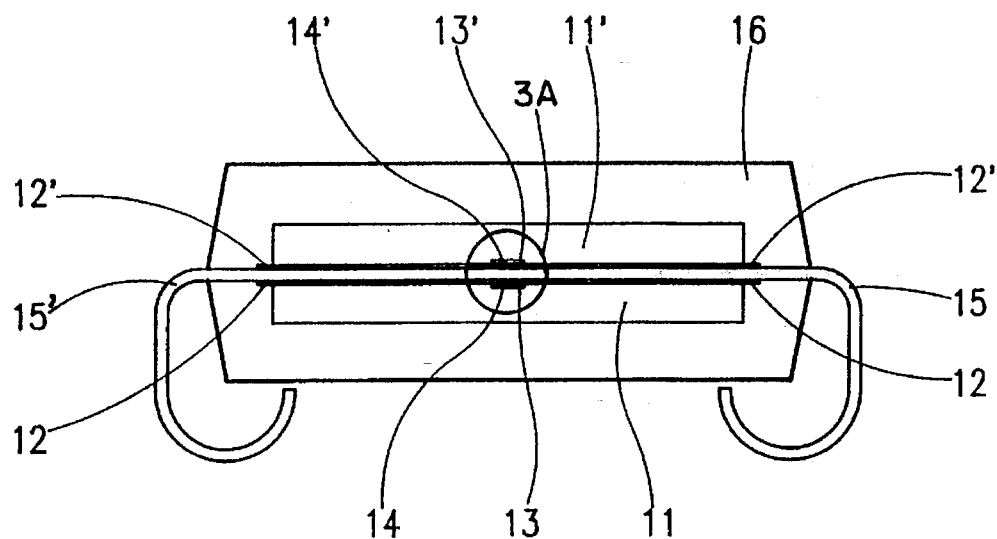
FIG. 3 is a view corresponding to FIG. 1 taken along arrows 3—3 in FIG. 8, but showing the present invention.
Figure 4:
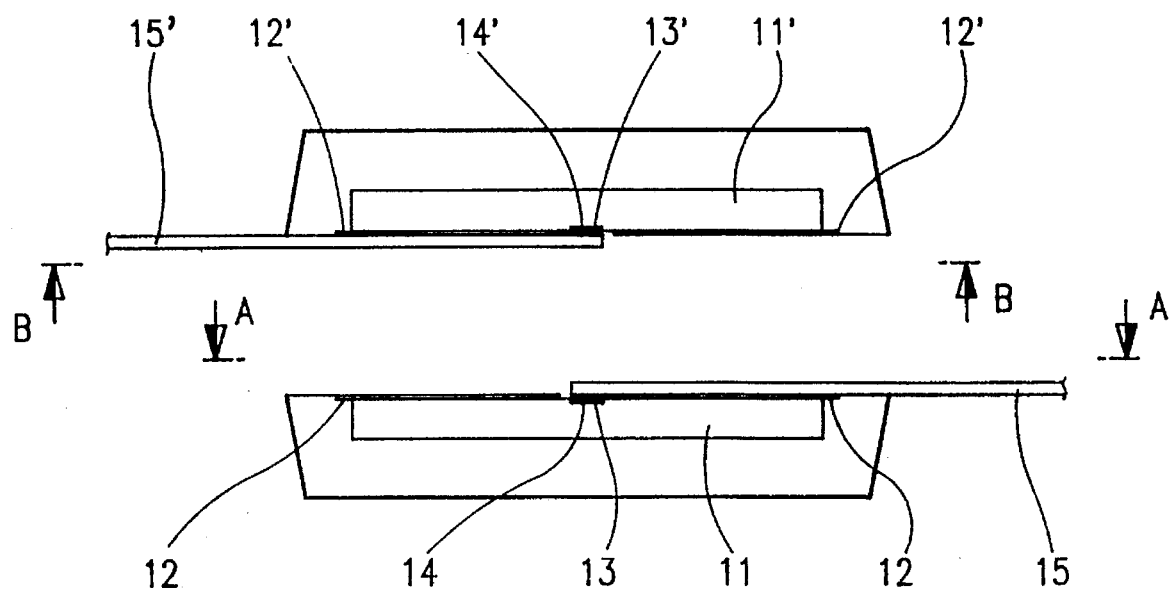
FIG. 4 is a cross sectional view showing an embodiment of a process for manufacturing a multi-chip semiconductor package according to the present Invention.

With reference to FIG. 3 which shows a construction of a LOC-COL(lead on chip-chip on lead)-SOJ type of semiconductor package according to the present invention, the package includes a pair of polyimide layers 12 which are coated on opposite upper side surfaces of a lower semiconductor chip 11 in order to provide an insulating layer having a predetermined thickness. The lower chip 11 has a plurality of longitudinally disposed pads 13 on each of which a lower solder 14 is provided. Each lower solder 14 is connected to an end of an inner lead 15 of a lead frame by a soldering process, preferably by a reflow soldering process, thereby causing the lower chip 11 to be electrically connected to the inner leads 15. In addition, an upper semiconductor chip 11" is overturned and superposed on the inner leads 15'. Here, the upper chip 11' includes a pair of polyimide layers 12' being applied on opposite surfaces thereof, respectively, and a plurality of pads 13' on each of which an upper solder 14' is provided. Each upper solder 14' is connected to a corresponding inner lead 15' by a soldering process, thereby causing the upper chip 11' to be electrically connected to the inner leads 15'. The multi-chip semiconductor package including the upper and lower chips 11' and 11 which are electrically connected to the inner leads 15 and 15' is then covered with an encapsulation epoxy resin layer 16 by a molding process so that a predetermined area of the package covering the lower and upper semiconductor chips 11 and 11' and a part of each inner lead 15 and 15' is coated.

Figure 3A:
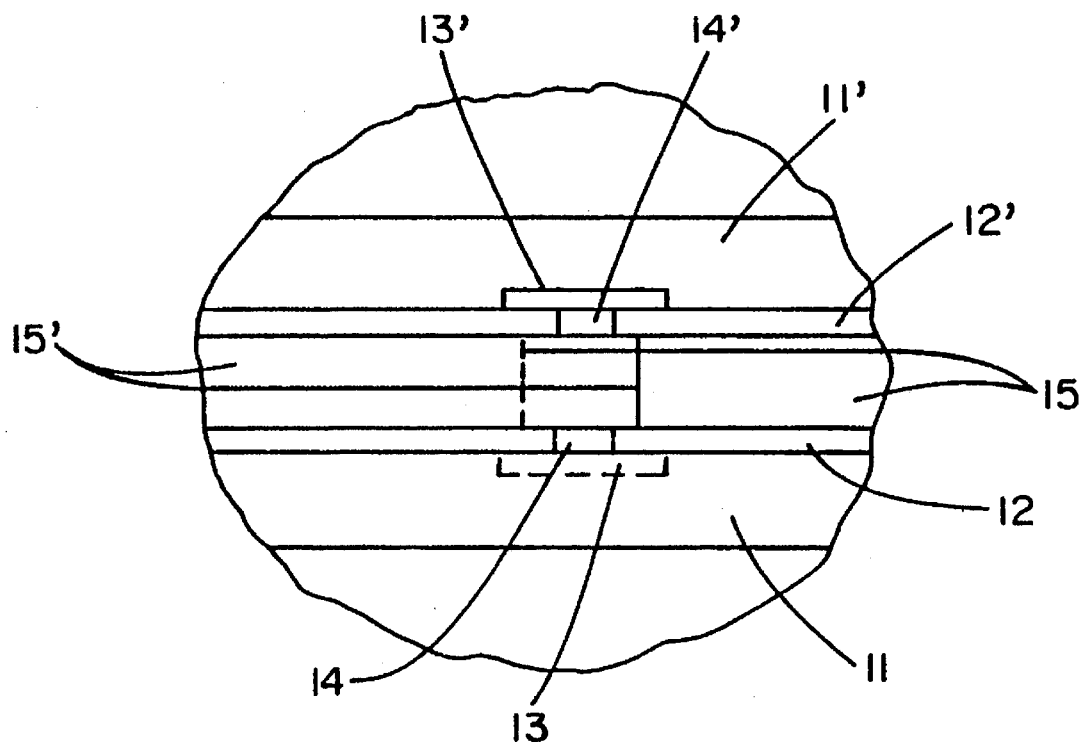
FIG. 3A an enlarged detail view of the structure show in circle 3A in FIG. 3.
Figure 8:
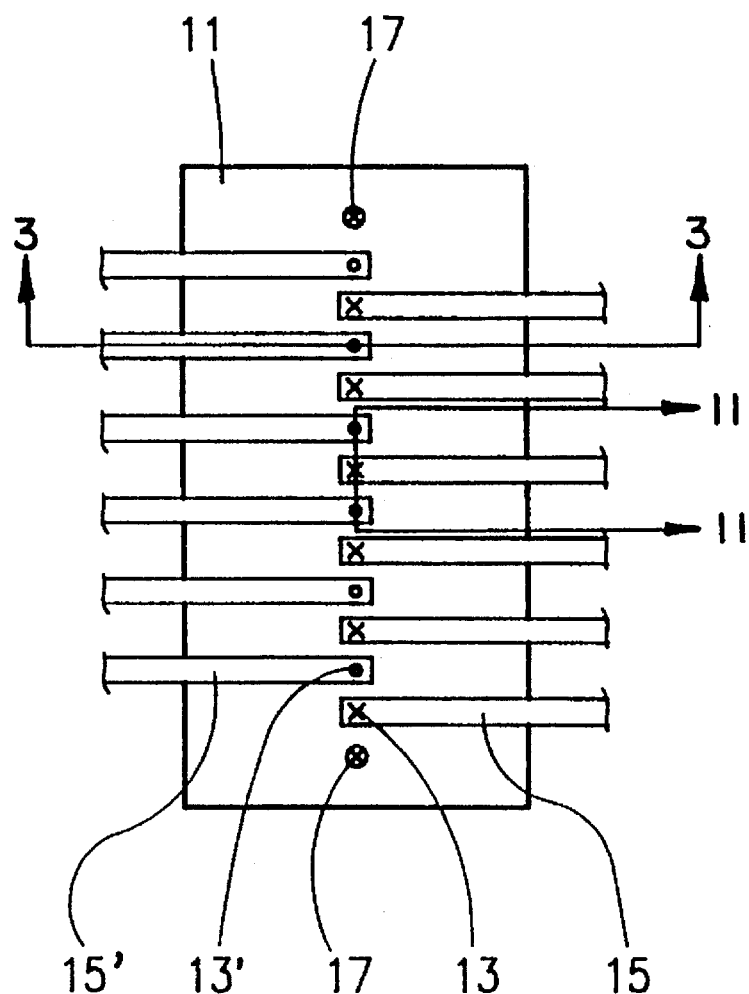
FIG. 8 is a plane view showing an embodiment of pad position of the multi-chip semiconductor package according to the present invention.

Referring to FIGS. 3A and 8, in FIG. 3A the pad 13 and solder 14 are indicated in phantom dashed lines because the pad 13 and solder 14 are not directly visible in the cross sectional view taken along arrows 3—3 in FIG. 8. The upper inner lead 15' extends to the vertical solid line corresponding to the right end of the upper inner lead 15', while the lower inner lead 15 extends to the vertical phantom dashed line corresponding to the left end of the lower inner lead 15. A part of the lower inner lead 15 between the vertical solid line and the vertical phantom dashed line is concealed by a part of the upper inner lead 15' between the vertical solid line and the vertical dashed line. Accordingly, it is clearly shown that the upper inner lead 15' is electrically contacted solely to the upper pad 13' of the upper chip 11' through the solder 14', and the lower inner lead 15 is electrically contacted solely with the lower pad 13 of the lower chip 11 through the solder 14.

As described above, in the multi-chip semiconductor package, the electrical connection between the inner leads 15 and the lower and upper semiconductor chips 11 and 11' is accomplished by a soldering process, such as a reflow soldering process, thereby substantially improving the integration of the package. In addition, during manufacture, the multi-chip package of this invention allows a conventional wire bonding process to be omitted, thereby improving a desired thickness thereof, reducing a noise, increasing the boosting speed, facilitating and simplifying the manufacturing process thereof.

In manufacturing the multi-chip semiconductor package of this invention, it is utilized flip-chip soldering process methods wherein a chip is soldered upside down on a printed circuit board. These soldering process methods will be described in detail as follows.

The methods for manufacturing the multi-chip semiconductor package of this invention are generally classified into two types, that is, a first method wherein a SIP(single inline package) is used and a second method wherein a two-way lead is used.

The first method or a SIP method will be first described in conjunction with FIGS. 4, 5A, 5B and 8. In this method, the pads 13 and 13' of the lower and upper chips 11 and 11' are arranged so as to be disposed along a longitudinal line as shown in FIG. 8.

In FIGS. 4, 5A, 5B and 8, the marks "O", "×" and "⊗" denote positions of the pads 13' of the upper chip 11', positions of the pads 13 of the lower chip 11 and positions of common pads 17, respectively. With reference to the drawings, both sides of upper and lower surfaces of the chips 11 and 11' are first provided thereon with the polyimide layers 12 and 12', respectively(step 1). The solders 14 and 14' are then formed on the pads 13 and 13' of the chips 11 and 11'(step 2). Thereafter, upon positioning ends of the inner leads 15 and 15' on the solders 14 and 14', respectively, so as to be uniformly arranged along the longitudinal line, the inner leads 15 and 15' are soldered to the solders 14 and 14' by a soldering process(step 3). Sequentially, a semiconductor chip as the upper chip 11' is superposed upside down on another semiconductor chip as the lower chip 11, then they are applied with an encapsulation epoxy coating so as to be connected to each other(step 4), thereby accomplishing the manufacture of the multi-chip package of this invention.

To provide the solders 14 and 14' on the pads 13 and 13' of the chips 11 and 11', the chips 11 and 11' are applied with a Cr/Cu/Au layer during a chip pad metallization, then coated with Pb-Sn alloys or any other solder alloys of which melting temperature is higher than epoxy curing temperature, by an evaporation, a sputtering process o an electroplating process. Thereafter, the chips 11 and 11' having been provided with the Cr/Cu/Au layer and the solder alloy coatings are temporarily heated at a predetermined temperature higher than an solder melting temperature in order to form ball type of solders 14 and 14' on the pads 13 and 13' by virtue of the surface tension of the melted alloys.

Sequentially, the inner leads 15 and 15' are located on the solders 14 and 14' of the chips 11 and 11' such that the ends of the leads 15 are disposed on the solders 14 and 14' at a direction, respectively. Thereafter, the chips 11 and 11' are heated in a fellow furnace to cause the inner leads 15 to be connected to the solders 14 and 14'. Then, a chip as the upper chip 11' is overturned and superposed on another chip as the lower chip 11. The chips 11' and 11 are then coated with the encapsulation epoxy resin in order to connect the chips to each other, thereafter, the chips 11 and 11 having the epoxy coating are subject to a conventional trimming/forming process, thereby finishing the manufacture of the multi-chip semiconductor package according to this invention, as shown in FIG. 3.

On the other hand, the second method wherein the two-way lead is used will be described in conjunction with FIGS. 6, 7A and 7B. As described in the drawings, both sides of upper and lower surfaces of the chips 11 and 11' are first provided thereon with the polyimide layers 12 and 12'(step 1). By the same manner as that described in the above first method the solders 14 and 14' are then formed on the pads 13 and 13' of the chips 11 and 11'(step 2), thereafter, upon positioning each end of the inner lead 15 on a corresponding solder 14 of the lower ship 11 so as to be disposed at opposite directions(step 3'). Sequentially, the upper chip 11' is leads 15' of the lower chip 11. The chips 11 and 11' are then heated by a reflow furnace In order to cause the inner leads 15 and 15' and the chips 11 and 11' to be connected to each other at the same time. Thereafter, the chips 11 and 11' are coated with an encapsulation epoxy resin(step 4'). The result chips 11 and 11' having the encapsulation epoxy coating Is subject to a forming/trimming process, thereby accomplishing the manufacture of the package of this invention, as shown in FIG. 3.

Figure 6:
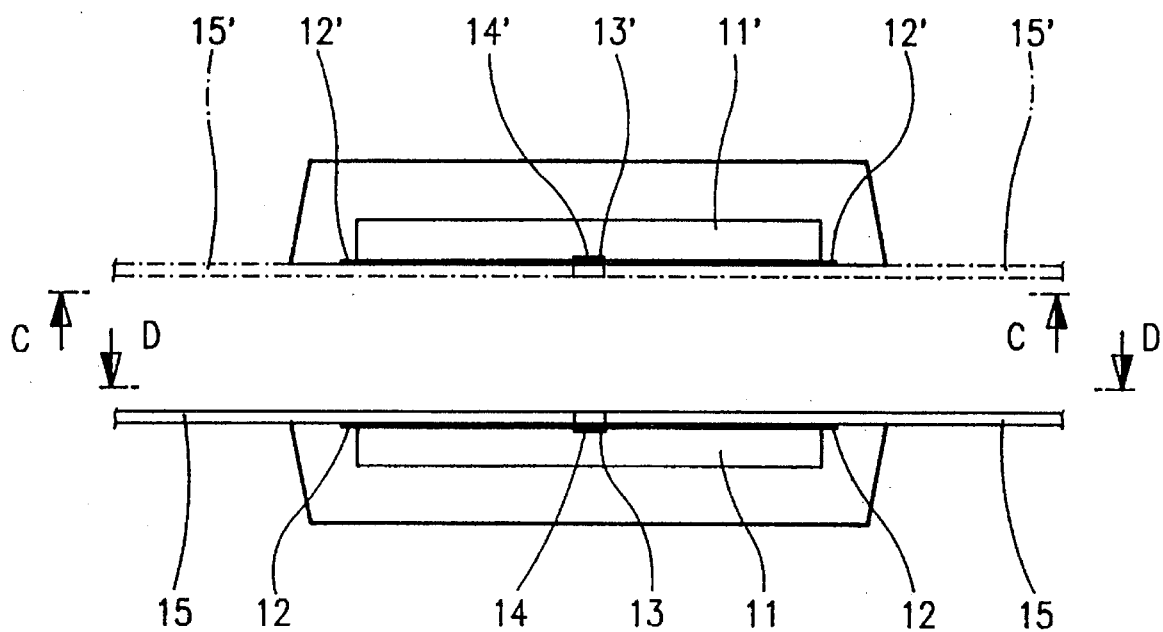
FIG. 6 is a view corresponding to FIG. 4, but showing another embodiment.
Figure 7A:
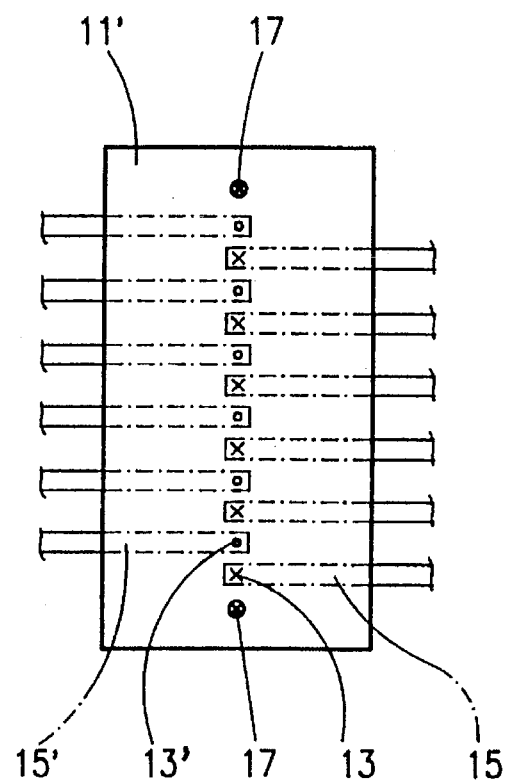
FIGS. 7A and 7B are cross sectional views taken along the lines C—C and D—D of FIG. 6, respectively.
Figure 7B:
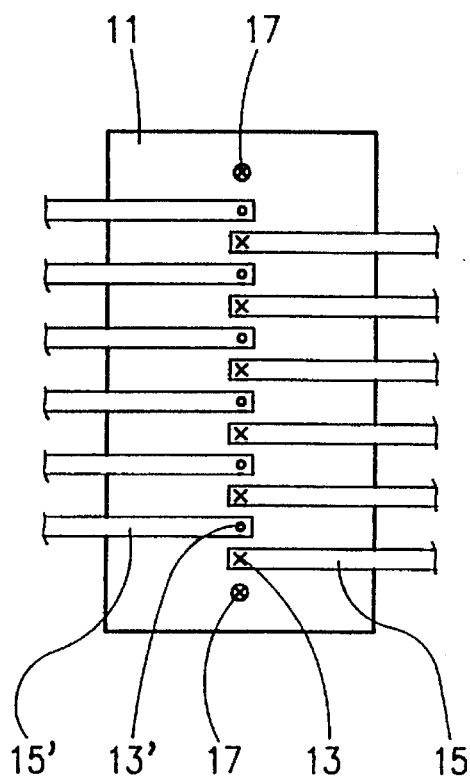

In FIG. 6, there is shown an inner lead 15, connected to the solder 14' of the upper chip 11' as represented at the phantom lines, however, the inner lead 15' may be preferably omitted in order to simplify the manufacturing process.

At this time, the package may be provided with the common pads 17 as shown at the mark "⊗" of the drawings.

Figure 9A:
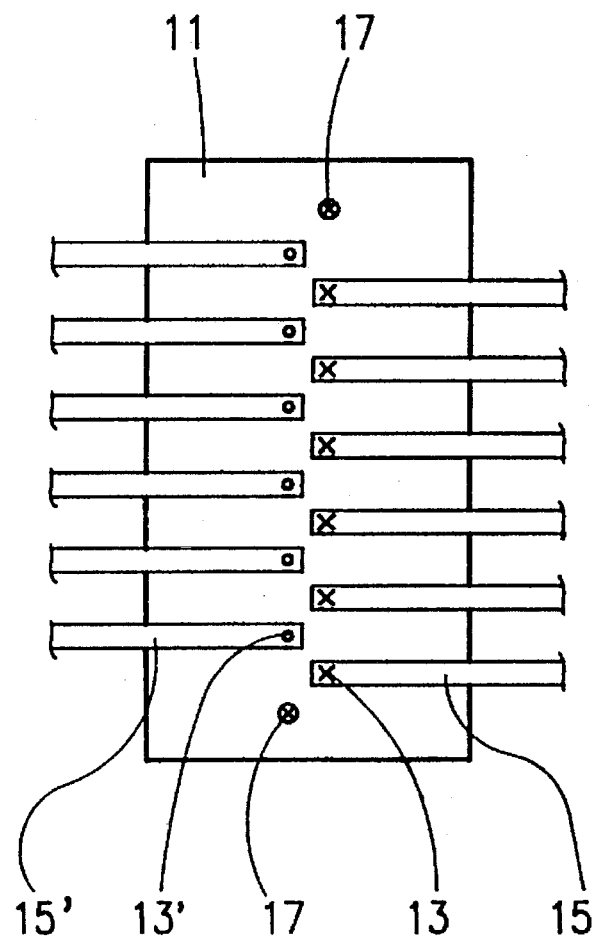
FIGS. 9A and 9B are a plan view and a cross sectional view, respectively, each showing another embodiment of pad position of the multi-chip semiconductor package according to the present invention.
Figure 9B:
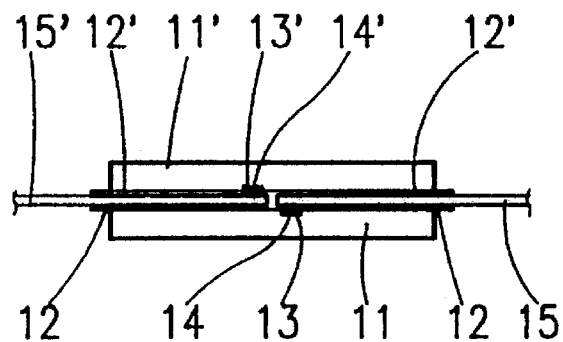
Figure 10:
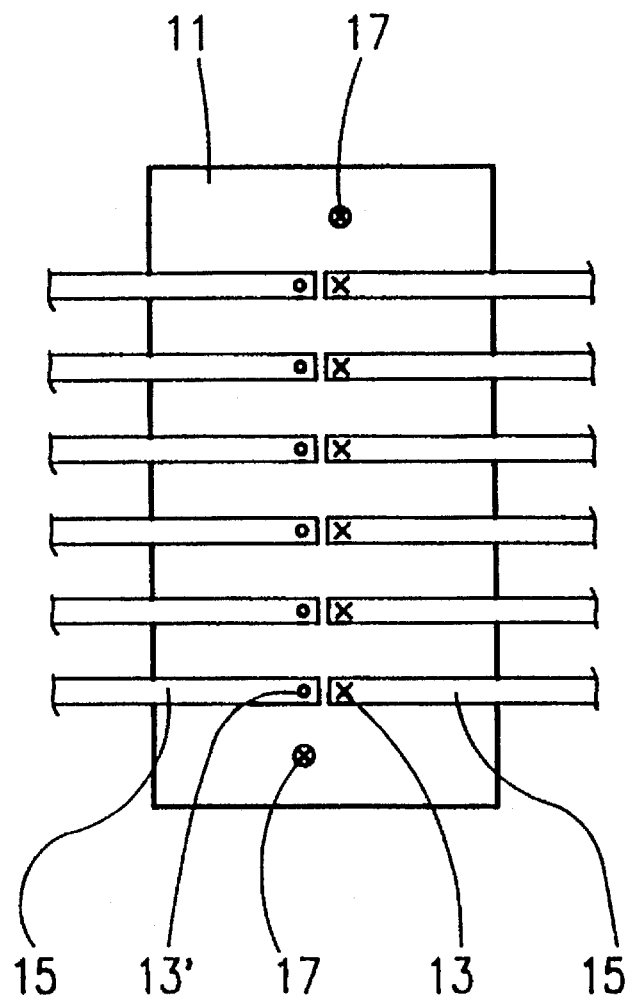
FIG. 10 is a view corresponding to FIG. 8, but showing still another embodiment of pad position according to the present invention.

On the other hand, if there may occur an overflow of the solders 14 and 14' such as due to intervals between the adjacent inner leads 15 and 15' of the lead frame during forming the solders 14 and 14', the pads 13 and 13' of the chips 11 and 11' are formed as being arranged along two longitudinal lines as represented in FIGS. 9 and 10, respectively, in order to increase a lead pitch between the inner leads 15 and 15', thereby substantially removing the occurrence of overflow.

in other words, two types of pads 13 and 13' of the chips 11 and 13' are formed so as to be alternately, zigzag disposed as shown in FIGS. 9A and 9B, then provided with the solders 14 and 14' formed thereon, respectively, or the pads 13 and 13' are formed in parallel to each other, thereby facing to each other as shown in FIG. 10.

Figure 11:
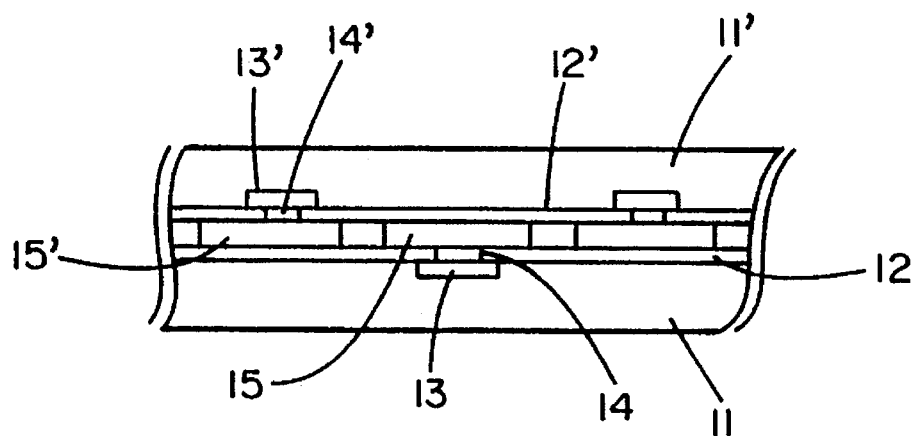
FIG. 11 is a view taken along arrows 11—11 in FIG. 8.
Figure 5A:
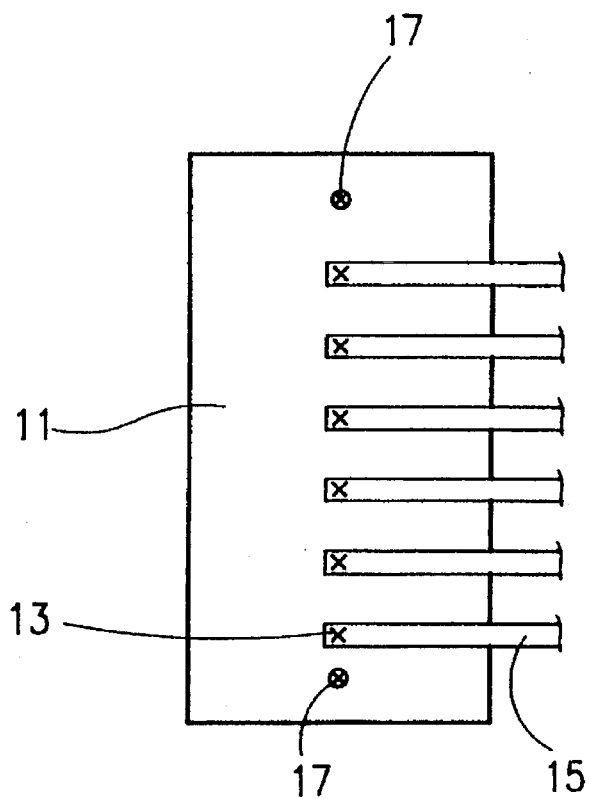
FIGS. 5A and 5B are cross sectional views taken along the section lines A—A and B—B of FIG. 4, respectively.
Figure 5B:
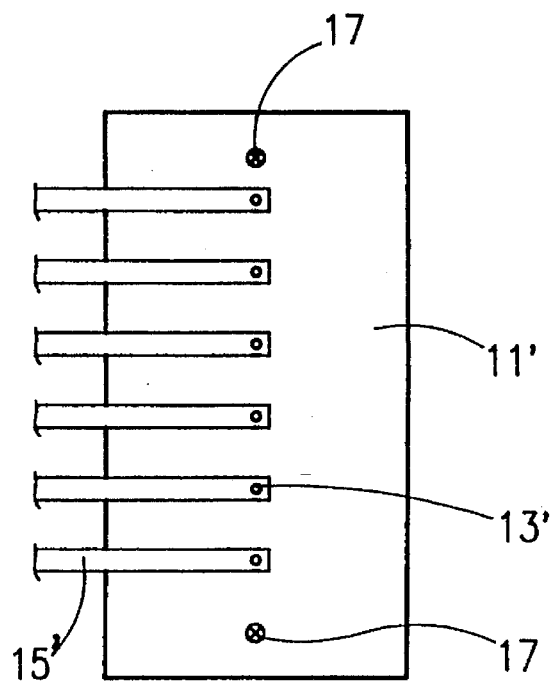

Referring to FIGS. 8 and 11, in FIG. 11 it is clearly shown that the upper inner lead 15' is electrically contacted solely with the upper pad 13' of the upper chip 11' through the solder 14', while the lower inner lead 15 is electrically contacted with the lower pad 13 of the lower chip through the solder 14.

In the above description, there has been described about the SOJ-type of package as a preferred embodiment. However, the present invention can be applied for various types of packages besides the SOJ type of package, such as the SOP(small outline package) type, the MSP(mini square package) type, and the QFP(quad flat package) type of packages in which one of the semiconductor chips 11 and 11' can be superposed on the other and also a soldering process is possible to be carried out.

As described above, the present invention provides a multi-chip semiconductor package and a method for manufacturing the package in which upper and lower semiconductor chips are soldered on inner leads of frame in order to connect them to each other, thereby providing advantages of improving an integration of circuit and thus having the desired thickness of the package to be accomplished. Moreover, the present invention provides another advantage of manufacturing a package by using two semiconductor chips, thereby reducing the manufacturing cost and substantially facilitating the manufacturing process due to decreasing the number of required elements.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
   a. upper and lower semiconductor chips which include mutually facing active faces, with each of said upper and lower semiconductor chips having a plurality of mutually facing pads positioned on intermediate portions of the active faces;
   b. solders formed on said plurality of pads;
   c. a plurality of first and a plurality of second connected inner leads alternately arranged and connected to said solders, wherein each of said first connected leads is connected solely to said upper semiconductor chip and each of said second connected leads is connected solely to said lower semiconductor chip, such that said upper and lower semiconductor chips are electrically connected to said first and second connected inner leads, respectively.

2. A semiconductor package according to claim 1, wherein said solders are made of a Pb-Sn alloy or any other solder alloys which have a melting temperature higher than an epoxy curing temperature.

3. A semiconductor package according to the claim 2, wherein each of said solders has a ball shape.

4. A semiconductor package comprising:
   a. upper and lower semiconductor chips which include mutually facing actives faces;
   b. a plurality of pads disposed along a longitudinal common line at an intermediate portion of the active face of each of said upper and lower semiconductor chips;
   c. solders formed on said plurality of pads;
   d. a plurality of inner leads extending to the center of said upper and lower semiconductor chips and being alternately arranged and connected to said solders such that said upper and lower semiconductor chips are electrically connected to said inner leads;
   e. upper and lower insulator layers disposed between the active faces of the upper and lower semiconductor chips and the inner leads, respectively, except at said plurality of pads; and
   f. an epoxy resin encapsulating the upper and lower semiconductor chips.

5. A semiconductor package according to claim 4, wherein said pads of the upper and lower chips are alternately disposed along said longitudinal common line located at the intermediate portions of the active faces.

6. A semiconductor package according to claim 4, wherein said pads of the upper and lower chips are disposed arranged along longitudinal lines extending across said upper and lower chips.

7. A semiconductor package according to claim 4, wherein said pads of the upper and lower chips are disposed in an alternating zigzag pattern with regard to the longitudinal common lines of said upper and lower semiconductor chips.

8. A semiconductor package according to claim 4, wherein said pads of the upper and lower chips are disposed so as to be parallel to each other.

9. A semiconductor package according to claim 6, wherein said package further comprises two or more common pads, wherein each of said common pads comprises one pad of each of said upper and lower chips which are commonly connected to one of said inner leads.

10. A semiconductor package according to claim 6, wherein said package includes at least one polyimide insulating layer between the active surface of each of the semiconductor chips and said inner leads.

11. A semiconductor package according to claim 6, wherein said package has an encapsulating epoxy coating covering said chips.

* * * * *